United States Patent [19]

Liu et al.

[11] Patent Number: 5,188,986

[45] Date of Patent: Feb. 23, 1993

[54] HYDROGEN PEROXIDE IN BASIC SOLUTION TO CLEAN POLYCRYSTALLINE SILICON AFTER PHOSPHOROUS DIFFUSION

[75] Inventors: Wei-Jyh Liu; Chih-Kung Huang; Chad-Yang Chen, all of Taipei, Taiwan

[73] Assignee: United Microelectronics Corporation, Hsinchu, Taiwan

[21] Appl. No.: 701,702

[22] Filed: May 17, 1991

[51] Int. Cl.$^5$ .......................................... H01L 21/302
[52] U.S. Cl. ................... 437/225; 437/228; 437/233; 437/240
[58] Field of Search ............... 437/225, 238, 240, 233, 437/228

[56] References Cited

U.S. PATENT DOCUMENTS

| | | | |
|---|---|---|---|
| 4,322,264 | 3/1982 | Rioult et al. | 156/655 |
| 4,433,008 | 2/1984 | Schnable et al. | 427/85 |
| 4,652,334 | 3/1987 | Jain et al. | 156/651 |
| 4,871,416 | 10/1989 | Fukuda | 156/635 |
| 4,939,103 | 7/1990 | Szoleyemy | 437/151 |
| 4,948,757 | 8/1990 | Jain et al. | 437/225 |

FOREIGN PATENT DOCUMENTS 3-07277 12/1990 Japan.

OTHER PUBLICATIONS

Wolf; "Silicon Processing for the VLSI Era"; vol. 1; pp. 264-265, 556-557; 1986.
Sze; "VLSI Technology"; 2nd Edition; pp. 44-45; 1983.

Primary Examiner—Brian E. Hearn
Assistant Examiner—Trung Dang
Attorney, Agent, or Firm—George O. Saile

[57] ABSTRACT

The method for providing a cleaned doped polycrystalline silicon surface involves providing a polycrystalline silicon body. The body is uniformly doped with a phosphorous impurity from a phosphorous vapor source, such as phosphorous pentoxide. The silicon oxide surface layer is removed from the doped polycrystalline silicon surface formed during the doping with a hydrofluoric acid solution. An important cleaning step of the doped polycrystalline silicon surface is now accomplished with a basic solution of hydrogen peroxide. The highly dense integrated circuit device process can now proceed with any desired patterning of the polycrystalline body or layer without the yield problems of the past.

15 Claims, 1 Drawing Sheet

FIG. 1
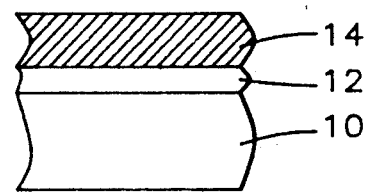
FIG. 2
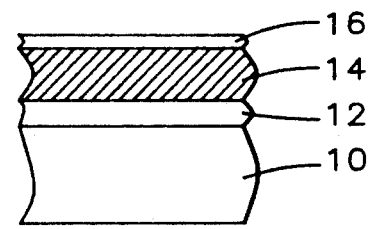
FIG. 3
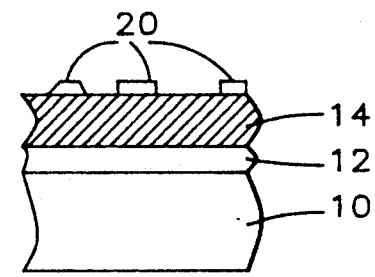
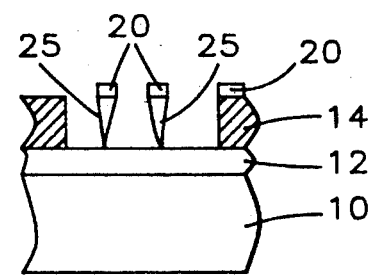
PRIOR ART
FIG. 4A
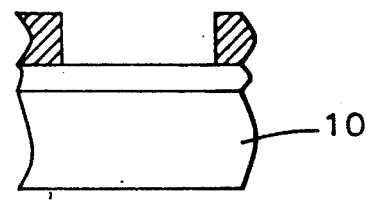
FIG. 4B

HYDROGEN PEROXIDE IN BASIC SOLUTION TO CLEAN POLYCRYSTALLINE SILICON AFTER PHOSPHOROUS DIFFUSION

BACKGROUND OF THE INVENTION

1. Field of the Invention

The invention involves the cleaning of a polycrystalline silicon body after it has been doped by a phosphorous diffusion process.

2. Description of the Prior Art

Polycrystalline silicon is widely used in the manufacture of integrated circuits and similar solid state devices. This material can be formed in various ways. One useful way is to deposit polycrystalline silicon as a layer onto an integrated circuit during its manufacture and to the dope, pattern or otherwise work this layer to form a part of the final integrated circuit structure.

Polycrystalline silicon layers are often formed undoped and then doped with a conductivity imparting material which as is known by those in the art as N or P type. Alternately, the layers of polycrystalline silicon are often formed doped with such N or P type material as it is deposited.

Phosphorous, which is an N type impurity is often the conductivity imparting material used in the manufacture of integrated circuits. This material can be included as the polycrystalline silicon is deposited. It can also be imparted to the polycrystalline silicon after it has been formed by either a thermal diffusion or ion implantation process.

Where a thermal diffusion process is used, all such gaseous phosphorus doping processed in silicon semiconductor fabrication technology require the introduction of phosphorus into the silicon by the following reaction:

$$2P_2O_5 + 5Si = 4P + 5SiO_2$$

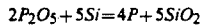

The resulting elemental phosphorous is in solid solution in the silicon surface layer. The preferred chemical process for forming phosphorous pentoxide in the equation in the vapor phase is by reacting phosphorous oxychloride with oxygen by the following reaction:

$$2POCl_3 + 1.5O_2 = P_2O_5 + 3Cl_2$$

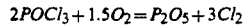

The phosphorous halide is available as 99.9999% pure with respect to transition and alkali metals. Phosphine is also a source for forming phosphorous pentoxide by the following reaction:

$$2PH_3 + 4O_2 = P_2O_5 + 3H_2O$$

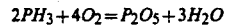

There are other less popular reactions for forming the phosphorous pentoxide that will not herein be discussed, but are known to those skilled in the art.

After the thermal doping process, the remaining silicon dioxide on the silicon surface is removed by conventional hydrofluoric acid etching. The next integrated circuit or the like processing will then continue as is appropriate. Up until recently this procedure caused no problem. However, with the movement into the highly dense integrated circuit submicron technology there has been encountered severe yield problems. We have found that the problems stem from an apparent residue that remains after the normal hydrofluoric acid etching.

It is therefore a primary object of this invention to overcome the yield problems in processing polycrystalline silicon bodies that are doped with phosphorous after deposition.

It is a further object of this invention to provide a cleaning process after the hydrofluoric acid etching that follows the phosphorous thermal diffusion process for solving the yield problems in the high density integrated circuit processing.

SUMMARY OF THE INVENTION

The method for providing a cleaned doped polycrystalline silicon surface involves providing a polycrystalline silicon body. The body is uniformly doped with a phosphorous impurity from a phosphorous vapor source, such as phosphorous pentoxide. The silicon oxide surface layer is removed from the doped polycrystalline silicon surface formed during the doping with a hydrofluoric acid solution. An important cleaning step of the doped polycrystalline silicon surface is now accomplished with a basic solution of hydrogen peroxide.

The highly dense integrated circuit device process can now proceed with any desired patterning of the polycrystalline body or layer without the yield problems of the past.

BRIEF DESCRIPTION OF THE DRAWINGS

FIGS. 1 through 3 are schematic cross sectional representations of the process of the invention prior to the novel cleaning step of the present invention.

FIG. 4A is a schematic cross sectional representation of the result of patterning of the polycrystalline silicon layer by the normal Prior Art procedures.

FIG. 4B is a schematic cross sectional representation of the result of patterning of the polycrystalline silicon layer after use of the novel cleaning process of the present invention.

DESCRIPTION OF THE PREFERRED EMBODIMENTS

Referring now more particularly to FIGS. 1 through 3 there is shown a method for depositing a polycrystalline silicon body or layer 14 on an insulator layer 12 which covers a substrate 10. In the manufacture of high density integrated circuits, the substrate 10 is typically silicon. Integrated circuit device structures (not shown) are formed in the substrate 10 as is well known by those skilled in the art. Various insulating layers and structures 12 are provided to cover the substrate 10. A very simple layer 12 is shown in the FIG. 1 as a elementary example of these types of insulating layers. A polycrystalline silicon layer 14 is deposited typically by pyrolyzing silane at a temperature between 575° to 650° C. The polycrystalline silicon is deposited without dopant. This is often preferred because the layer will be more uniform in its coverage of the surfaces upon which it has been deposited. This completes the FIG. 1 structure.

The polycrystalline layer 14 is now doped by a thermal diffusion process with a phosphorous dopant which is typically phosphorous pentoxide which is derived from preferably a phosphorous oxychloride source gas as was described above in the Background of the Invention. The result of this process is shown in FIG. 2 wherein a thin phosphorous silicon oxide layer 16 is formed on the polycrystalline silicon layer 14 and the polycrystalline silicon layer 14 is now N+ doped as indicated.

The next step is to remove this layer 16 by a conventional hydrofluoric acid solution, typically 10 parts water to one part hydrofluoric acid which may or may not be buffered. After this etching step, the polycrystalline silicon surface has always been considered ready for subsequent processing, such as lithography and etching or patterning processes.

The subsequent processing has not been a particular problem where the feature size has been well above the one micron size. We have found that with the high density integrated circuit feature sizes of about one or less microns, that yield problems have developed due to the leaving of small light yellow colored residue spots or freaks of some kind on the polycrystalline silicon surface as indicated at 20 in FIG. 3. When the normal lithography and reactive ion etching, for example is used to pattern the polycrystalline silicon layer 14, the result is incomplete etching as seen in the Prior Art schematic illustration of FIG. 4A. Where a residue spot or freak 20 is left upon the polycrystalline silicon surface, there will be incomplete etching of the layer 14 to give point residues shown at 25. This effect we have found to be the cause of yield problems for these high density integrated circuits.

We have learned to overcome this problem shown in FIG. 3 and 4A, by use of a special cleaning step. The FIG. 3 structure is cleaned in a bath of a basic solution of hydrogen peroxide. The operative temperature is greater than about 70° C. and preferred temperature is between about 75° to 100° C. The preferred length of time for cleaning is more than about 5 minutes. The known operative basic compositions used in conjunction with the hydrogen peroxide are ammonium hydroxide, sodium hydroxide, tetra methyl hydroxide, and tetra ethyl hydroxide. One would have expected that if the basic solutions of hydrogen peroxide would operate, that acidic solutions of hydrogen peroxide would also be operative to improve the yield problems. Surprisingly, the acidic solutions of hydrogen peroxide do not work to improve the yields.

EXAMPLES

A silicon substrate with a silicon oxide layer thereon was provided. A layer of polycrystalline silicon having a thickness of 5500 Angstroms was deposited by pyrolyzing silane at 625° C. in a low temperature chemical vapor deposition furnace. One hundred percent silane was used at a pressure of 0.15 Torr.

The phosphorous thermal diffusion was carried out in a high temperature furnace at 950° C. using phosphorus oxychloride as the dopant source. The phosphorus oxychloride was kept at a temperature around 22° C., the partial pressure of the phosphorus oxychloride at this temperature was introduced by nitrogen carrier gas into the furnace. The gas reacted with oxygen to form the phosphorus pentoxide gas. The phosphorus pentoxide then reacts with the polycrystalline silicon according to the reaction previously described. The total doping time was about 10 minutes and the resulting sheet resistance was about 12 to 15 ohms per square. The phosphorous silicon oxide layer was removed using hydrofluoric acid solution of 10 parts water and 1 part HF. Lithography and reactive ion etching was done using a LAM 490 etcher with sulfur hexafluoride.

The Examples 1 through 10 in the below Table give the composition of the solution, the initial and highest temperature in °C. during the cleaning for hydrogen peroxide, basic hydrogen peroxide solutions and acidic hydrogen peroxide solutions, and observation results before and after the polysilicon etching. The observations were made using a microscope having a magnification of 500 times.

TABLE

| EX | Composition | Init. | High | Before | After |
|----|-------------|-------|------|--------|-------|
| 1 | 5 - water<br>1 - NH$_4$OH (30% wt)<br>1 - H$_2$O$_2$ (30% wt) | 75 | 75 | clean | clean |
| 2 | 6 - H$_2$O$_2$ (30% wt)<br>1 - NH$_4$OH (30% wt) | 75 | 98 | clean | clean |
| 3 | 3 - H$_2$O$_2$ (30% wt)<br>1 - (CH$_3$)$_4$NOH | 75 | 98 | clean | clean |
| 4 | 12 - H$_2$O$_2$ (30% wt)<br>1 - NaOH (1M) | 75 | 98 | clean | clean |
| 5 | 5 - water<br>1 - NH$_4$OH<br>1 - H$_2$O$_2$ (30% wt) | 25 | 25 | freak | point residue |
| 6 | 7 - H$_2$SO$_4$ (98% wt)<br>1 - H$_2$O$_2$ (30% wt) | 125 | 125 | freak | point residue |
| 7 | 1 - HNO$_3$ (70% wt)<br>6 - H$_2$O$_2$ (30% wt) | 75 | 98 | freak | point residue |
| 8 | 1 - HCl (15M)<br>6 - H$_2$O$_2$ (30% wt) | 75 | 98 | freak | point residue |
| 9 | H$_2$O$_2$ (30% wt) | 25 | 25 | freak | point residue |
| 10 | H$_2$O$_2$ (30% wt) | 75 | 75 | freak | point residue |

The polycrystalline silicon was exposed to the cleaning compositions for 10 minutes in all Examples.

The Examples show that only the basic hydrogen peroxide solutions provide adequate cleaning for the polycrystalline silicon body. The acidic hydrogen peroxide solution, hydrogen peroxide alone and acid solutions alone all failed. We also found that temperature is very critical from a kinetic viewpoint for the basic hydrogen peroxide solution, because it represents how fast the reaction can occur. If the temperature is too low, as seen in our Example 5 wherein 25° C. was used, the reacting system can not get enough thermo energy to overcome the reaction potential barrier and thus the cleaning reaction is not satisfactory.

While the invention has been particularly shown and described with reference to the preferred embodiments thereof, it will be understood by those skilled in the art that various changes in form and details may be made without departing from the spirit and scope of the invention.

What is claimed is:

1. Method for forming a high yielding anisotropically patterned thermally doped polycrystalline silicon surface comprising:
   providing a polycrystalline silicon body;
   doping said body by a thermal diffusion process uniformly with a phosphorous impurity from a phosphorous pentoxide vapor source;
   wherein said doping forms a thin phosphorus silicon oxide layer on said surface of said polycrystalline silicon:
   removing said silicon oxide surface layer from said doped polycrystalline silicon surface formed during said doping with a hydrofluoric acid solution;
   cleaning said doped polycrystalline silicon surface with a basic solution of hydrogen peroxide; and
   patterning said polycrystalline silicon layer by lithography and anisotropic etching with a reactive ion etching gas.

2. The method of claim 1 wherein the said phosphorous pentoxide vapor is an reaction product from a highly clean phosphorous oxychloride source.

3. The method of claim 1 wherein the polycrystalline silicon body is a layer on the surface of a high density integrated circuit structure and subsequent to said cleaning completing the said high density integrated circuit structure.

4. The method of claim 1 wherein the said cleaning is performed between about a temperature of 75° to 100° C. and for more than about 5 minutes.

5. The method of claim 1 wherein the basic component of the said basic solution is ammonium hydroxide.

6. The method of claim 1 wherein the basic component of the said basic solution is tetra methyl ammonium hydroxide.

7. The method of claim 1 wherein the basic component of the said basic solution is sodium hydroxide.

8. The method of claim 1 wherein the basic component of the said basic solution is tetra ethyl ammonium hydroxide.

9. The method for forming a high yielding anisotropically patterned thermally doped polycrystalline silicon layer surface on a high density integrated circuit structure comprising:
providing a polycrystalline silicon layer;
doping said layer by a thermal diffusion process uniformly with a phosphorous impurity from a phosphorous pentoxide vapor source wherein said doping forms a thin phosphorus silicon oxide layer on said surface of said polycrystalline silicon;
removing said silicon oxide surface layer from said doped polycrystalline silicon layer surface formed during said doping with a hydrofluoric acid solution;
cleaning said doped polycrystalline silicon surface with a basic solution of hydrogen peroxide at a temperature greater than about 70° C. and less than 100° C. for more than 5 minutes; and
patterning said polycrystalline silicon layer by lithography and anisotropic etching with a reactive ion etching gas.

10. The method of claim 9 wherein the said phosphorous pentoxide vapor is an reaction product from a highly clean phosphorous oxychloride source.

11. The method of claim 9 wherein the basic component of the said basic solution is ammonium hydroxide.

12. The method of claim 9 wherein the basic component of the said basic solution is tetra methyl ammonium hydroxide.

13. The method of claim 9 wherein the basic component of the said basic solution is sodium hydroxide.

14. The method of claim 9 wherein the basic component of the said basic solution is tetra ethyl ammonium hydroxide.

15. The method of claim 9 wherein the said reactive ion etching gas is sulfur hexafluoride.

* * * * *